United States Patent
Onishi

(10) Patent No.: US 9,614,039 B2
(45) Date of Patent: Apr. 4, 2017

(54) SEMICONDUCTOR DEVICE AND METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventor: Toru Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/103,527

(22) PCT Filed: Nov. 12, 2014

(86) PCT No.: PCT/JP2014/079957
§ 371 (c)(1),
(2) Date: Jun. 10, 2016

(87) PCT Pub. No.: WO2015/118743
PCT Pub. Date: Aug. 13, 2015

(65) Prior Publication Data
US 2016/0336402 A1  Nov. 17, 2016

(30) Foreign Application Priority Data
Feb. 4, 2014  (JP) .................................. 2014-019022

(51) Int. Cl.
*H01L 29/06* (2006.01)
*H01L 29/66* (2006.01)
(Continued)

(52) U.S. Cl.
CPC ...... *H01L 29/0696* (2013.01); *H01L 21/7684* (2013.01); *H01L 21/76802* (2013.01);
(Continued)

(58) Field of Classification Search
CPC ......... H01L 51/56; H01L 33/62; H01L 33/06; H01L 33/32; H01L 33/502
See application file for complete search history.

(56) References Cited

U.S. PATENT DOCUMENTS

| | | |
|---|---|---|
| 5,084,413 A | 1/1992 | Fujita et al. |
| 2006/0226475 A1 | 10/2006 | Yamamoto et al. |
| 2007/0040213 A1* | 2/2007 | Hotta .................. H01L 29/0696 257/330 |
| 2007/0210350 A1 | 9/2007 | Omura et al. |

(Continued)

FOREIGN PATENT DOCUMENTS

| | | |
|---|---|---|
| EP | 1 130 653 A2 | 9/2001 |
| JP | S62-204523 A | 9/1987 |

(Continued)

*Primary Examiner* — Andy Huynh
(74) *Attorney, Agent, or Firm* — Oliff PLC

(57) ABSTRACT

A semiconductor device includes a plurality of trench gates provided abreast in a semiconductor substrate; an interlayer insulation film having opening from which a part of a front surface of the semiconductor substrate is exposed; and contact plugs provided in the openings. The interlayer insulation film comprises a plurality of first portions, each of which covers a corresponding one of the trench gates, and a plurality of second portions, each of which is provided between adjacent first portions and along a direction intersecting with the first portions. The openings are provided at an area surrounded by the first portions and the second portions, a length of the openings in a direction along the first portions is shorter than a length of the openings in a direction along the second portions intersecting with the first portions.

4 Claims, 11 Drawing Sheets

(51) Int. Cl.
  *H01L 29/739* (2006.01)
  *H01L 21/768* (2006.01)
  *H01L 23/535* (2006.01)
  *H01L 29/423* (2006.01)
  *H01L 29/78* (2006.01)
  *H01L 29/417* (2006.01)
  *H01L 29/45* (2006.01)
  *H01L 23/485* (2006.01)

(52) U.S. Cl.
  CPC .. *H01L 21/76816* (2013.01); *H01L 21/76877* (2013.01); *H01L 23/535* (2013.01); *H01L 29/4236* (2013.01); *H01L 29/66348* (2013.01); *H01L 29/7397* (2013.01); *H01L 29/7813* (2013.01); *H01L 23/485* (2013.01); *H01L 29/41741* (2013.01); *H01L 29/45* (2013.01); *H01L 2924/0002* (2013.01)

(56) References Cited

U.S. PATENT DOCUMENTS

| | | |
|---|---|---|
| 2010/0155833 A1 | 6/2010 | Sumida et al. |
| 2010/0258863 A1 | 10/2010 | Kaneko |
| 2010/0264546 A1 | 10/2010 | Torii et al. |
| 2010/0308401 A1* | 12/2010 | Narazaki ............ H01L 29/4236 257/330 |

FOREIGN PATENT DOCUMENTS

| | | |
|---|---|---|
| JP | S62-243326 A | 10/1987 |
| JP | H02-96331 A | 4/1990 |
| JP | 2005-136270 A | 5/2005 |
| JP | 2007-273931 A | 10/2007 |
| JP | 2009-152364 A | 7/2009 |
| JP | 2010-147219 A | 7/2010 |
| JP | 2010-251422 A | 11/2010 |
| JP | 2012-114321 A | 6/2012 |
| JP | 2013-183049 A | 9/2013 |

* cited by examiner

SEMICONDUCTOR DEVICE AND METHOD OF MANUFACTURING SEMICONDUCTOR DEVICE

TECHNICAL FIELD

The art disclosed herein relates to a semiconductor device and a method of manufacturing a semiconductor device.

BACKGROUND ART

Conventionally, a semiconductor device in which an interlayer insulating film is provided on a front surface of a semiconductor substrate is known. Such a semiconductor device is disclosed for example in Patent Literature 1 (Japanese Patent Application Publication No. 2005-136270). The semiconductor device of Patent Literature 1 includes a semiconductor substrate in which a plurality of trench gates is provided, and an interlayer insulating film provided on a front surface of the semiconductor substrate so as to cover the trench gates. The interlayer insulating film is provided with openings (contact holes) through which a part of the front surface of the semiconductor substrate is exposed. Contact plugs are filled in the openings.

SUMMARY

Technical Problem

In a semiconductor device as above, in forming the contact plugs, a method in which a material of the contact plugs is deposited and a thin film configured of the material of the contact plugs is conventionally known. The material of the contact plugs is deposited on the interlayer insulating film, as well as on the semiconductor substrate exposed in the openings (contact holes) of the interlayer insulating film. Further, an excessive portion of the thin film is removed after having formed the thin film configured of the material of the contact plugs. Due to this, the contact plugs filled in the openings of the interlayer insulating film are formed. However, when the openings in the interlayer insulating film are made large, a film thickness of the thin film may become large upon the formation of the thin film configured of the material of the contact plugs. On the other hand, when the openings in the interlayer insulating film above the trench gates are made small, there is a possibility that a contact resistance becomes large. The description herein aims to provide a technique that suppresses a contact resistance from becoming large while enabling a thin film thickness for a thin film that is needed to form a contact plug.

Solution to Problem

A semiconductor device comprises: a plurality of first trench gates provided abreast in a semiconductor substrate; an interlayer insulation film provided on a front surface of the semiconductor substrate, and having an opening from which a part of the front surface of the semiconductor substrate is exposed; and a contact plug provided in the opening. The interlayer insulation film comprises a plurality of first portions, each of which is provided along a front surface of a corresponding one of the first trench gates to cover the corresponding first trench gate, and a plurality of second portions, each of which is provided between adjacent first portions and along a direction intersecting with the first portions. The opening is provided at an area surrounded by the first portions and the second portions, and a length of the opening in a direction along the first portions is shorter than a length of the opening in a direction along the second portions intersecting with the first portions.

According to this configuration, since the length of the opening in the direction along the first portions of the interlayer insulating film is short, a material of the contact plug can quickly fill an entirety of the opening upon forming the contact plug. Due to this, a film thickness of a thin film that is needed to form the contact plug can be made small. Further, positions of the second portions of the interlayer insulating film can be adjusted without giving consideration to the first trench gates. Thus, the length of the opening in the direction along the first portions can be made short while maintaining a contact resistance between the contact plug and a semiconductor region in the semiconductor substrate at a low resistance. Thus, the contact resistance is suppressed from becoming large while enabling the thin film thickness for the thin film that is needed to form the contact plug.

Further, in the above semiconductor device, a width of the second portions may be narrower than a width of the first portions in a plan view.

Further, the above semiconductor device may further comprise a plurality of emitter regions, each of which is provided along a front surface of a corresponding one of the first trench gates. Further, the plurality of first trench gates may be provided in stripes when observed along a direction perpendicular to the front surface of the semiconductor substrate.

Further, the above semiconductor device may further comprise a plurality of second trench gates provided in the direction intersecting with the first portions. Further, the interlayer insulation film may comprise a plurality of third portions, each of which is provided along a front surface of a corresponding one of the second trench gates to cover the corresponding second trench gate.

Further, the present specification discloses a method of manufacturing a semiconductor device that comprises a plurality of first trench gates provided abreast in a semiconductor substrate, and an interlayer insulation film provided on a front surface of the semiconductor substrate and having an opening from which a part of the front surface of the semiconductor substrate is exposed, the method comprising forming a contact plug in the opening. The interlayer insulation film comprises a plurality of first portions, each of which is provided along a front surface of a corresponding one of the first trench gates to cover the corresponding first trench gate, and a plurality of second portions provided between adjacent first portions and along a direction intersecting with the first portions. The opening is provided at an area surrounded by the first portions and the second portions, and a length of the opening in a direction along the first portions is shorter than a length of the opening in a direction along the second portions intersecting with the first portions.

In the manufacturing method disclosed herein, the forming of the contact plug may comprise depositing a material of the contact plug in the opening, and removing the material of the contact plug deposited above the interlayer insulation film.

DETAILED DESCRIPTION

Figure 1:
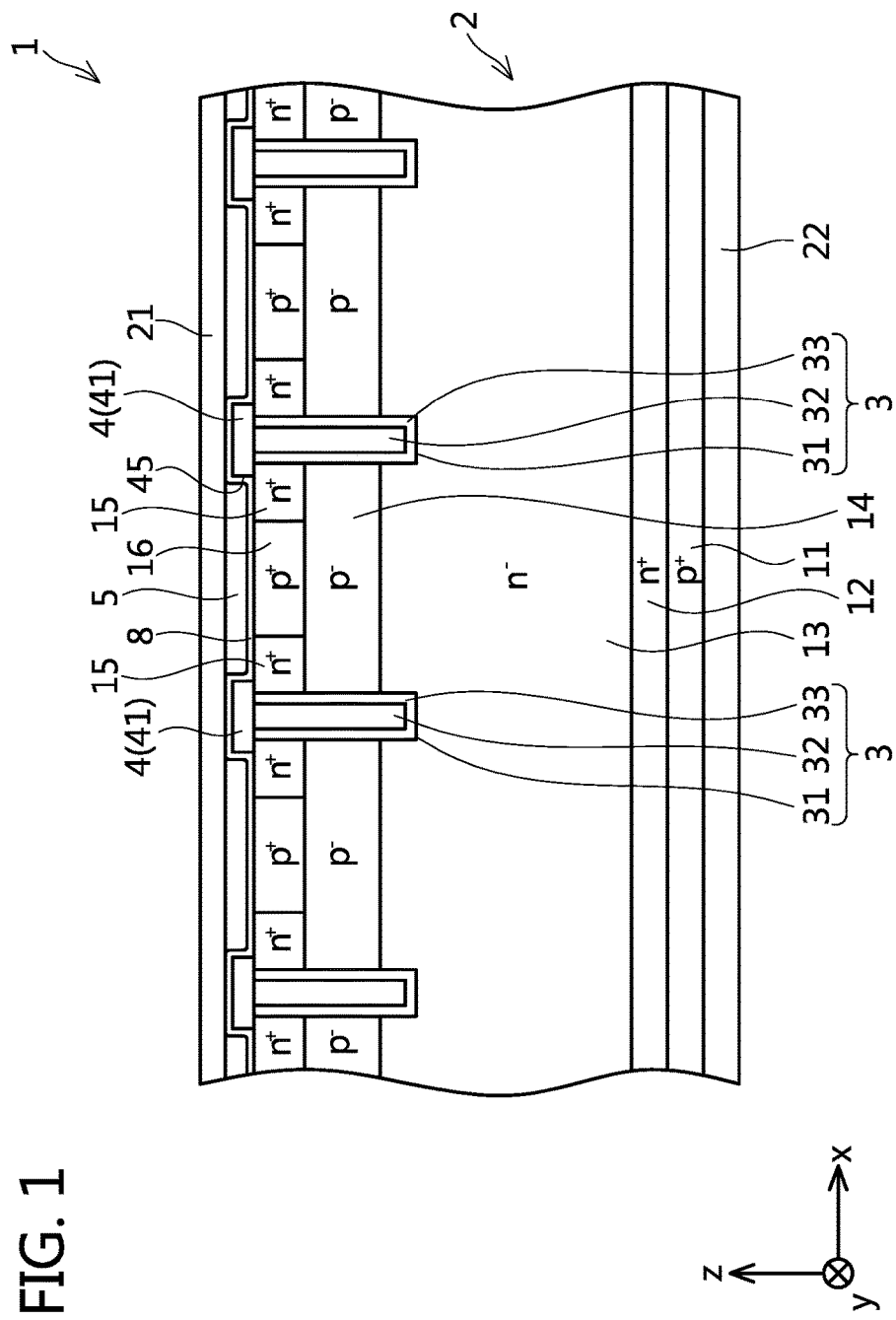
FIG. 1 is a cross sectional view of a semiconductor device of an embodiment.

Hereinbelow, an embodiment will be described with reference to the attached drawings. As shown in FIG. 1, a semiconductor device 1 of the embodiment is a trench gate type semiconductor device provided with a plurality of trench gates 3 in a semiconductor substrate 2. In the present embodiment, a vertical IGBT (Insulated Gate Bipolar Transistor) is exemplified as the semiconductor device 1. The IGBT is used for example in a switching element for power control of various electric devices in an automobile.

As a material of the semiconductor substrate 2, for example, silicon (Si) or silicon carbide (SiC) may be used, and a semiconductor element is formed therein by doping impurities therein. The semiconductor substrate 2 comprises a p-type collector region 11, an n-type buffer region 12 provided on the collector region 11, an n-type drill region 13 provided on the buffer region 12, a p-type body region 14 provided on the drift region 13, n-type emitter regions 15 provided on the body region 14, and p-type contact regions 16 provided on the body region 14. Further, a rear surface electrode 22 is provided on a rear surface of the semiconductor substrate 2. An interlayer insulating film 4 and a barrier metal film 8 are provided on a front surface of the semiconductor substrate 2. Contact plugs 5 and a front surface electrode 21 are provided on the barrier metal film 8.

The collector region 11 is provided on a rear surface side of the semiconductor substrate 2. The rear surface electrode 22 is provided under the collector region 11. The buffer region 12 separates the collector region 11 and the drift region 13. An n-type impurity concentration of the buffer region 12 is higher than an n-type impurity concentration of the drift region 13. The drift region 13 is provided between the body region 14 and the buffer region 12. The body region 14 makes contact with the emitter regions 15 and the contact regions 16. The body region 14 separates the emitter regions 15 and the drift region 13. Channels through which electrons pass are generated in the body region 14. The emitter regions 15 and the contact regions 16 are provided on a front surface side of the semiconductor substrate 2. An n- type impurity concentration of the emitter regions 15 is higher than the n-type impurity concentration of the drift region 13. A p-type impurity concentration of the contact regions 16 is higher than a p-type impurity concentration of the body region 14. The contact plugs 5 are provided on the emitter regions 15 and the contact regions 16 via the barrier metal film 8.

Figure 2:
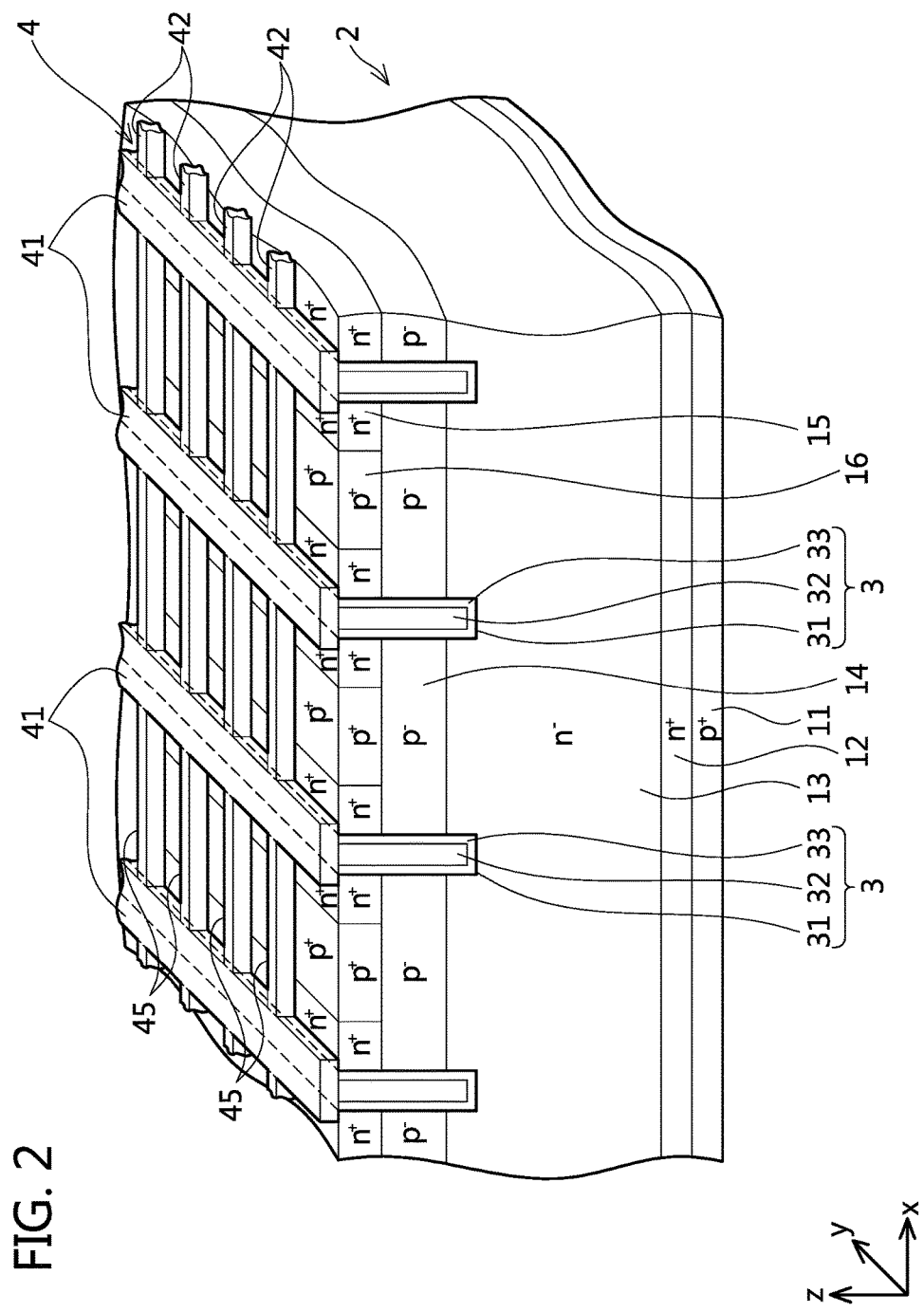
FIG. 2 is a perspective view of the semiconductor device of the embodiment.
Figure 3:
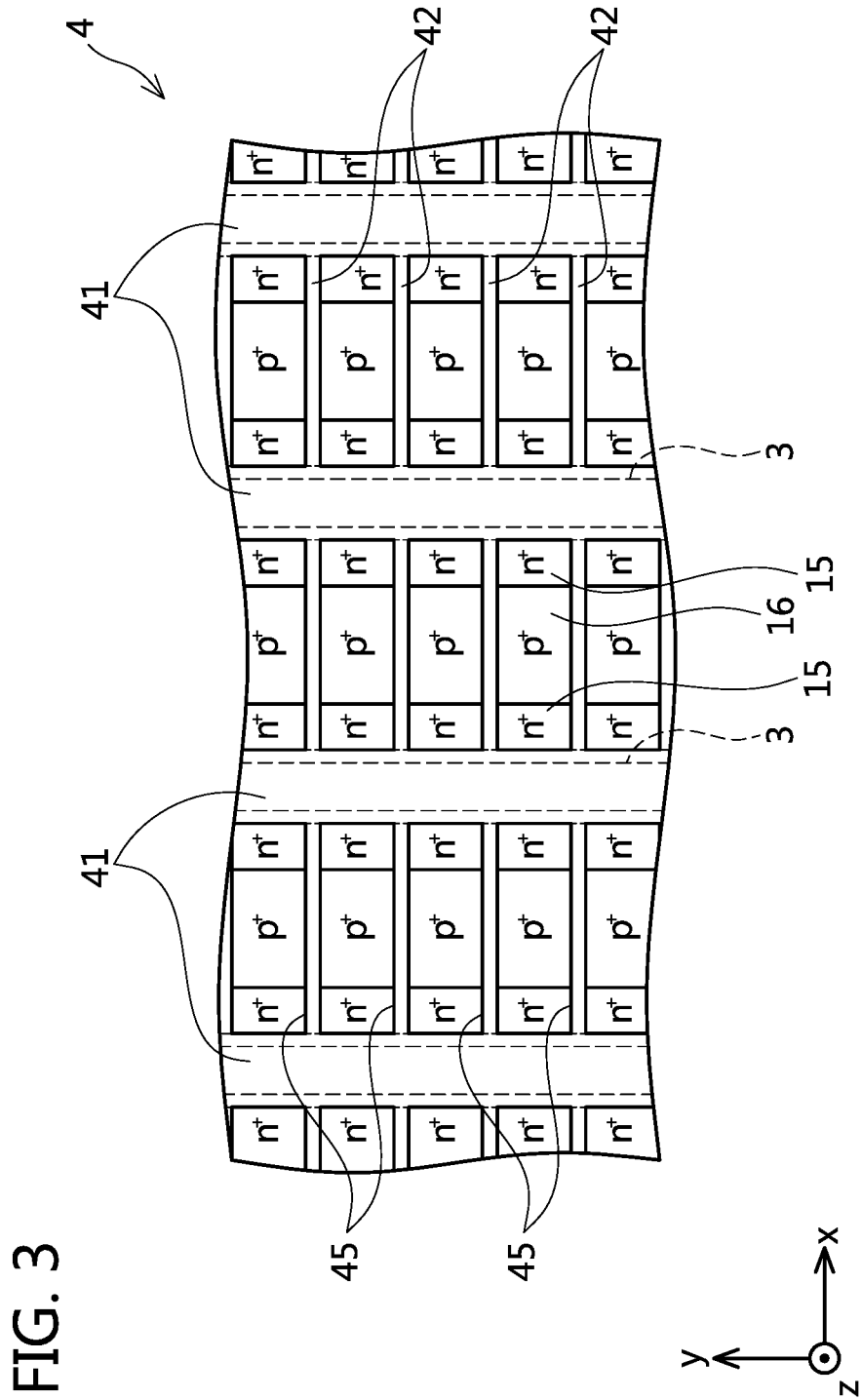
FIG. 3 is a plan view of the semiconductor device of the embodiment.

Further, a plurality of trenches 31 is provided in the semiconductor substrate 2. A gate insulating film 33 is provided on an inner surface of each trench 31. A gate electrode 32 is provided inside each trench 31 (inside of the gate insulating film 33). Each trench gate 3 is configured of the trench 31, the gate insulating film 33, and the gate electrode 32. The plurality of trench gates 3 is arranged adjacent to one another with intervals in a lateral direction (x direction). Further, as shown in FIGS. 2 and 3, the plurality of trench gates 3 is arranged to extend in parallel along a vertical direction (y direction). The plurality of trench gates 3 is provided in stripes when observed along a direction perpendicular to the front surface of the semiconductor substrate 2. Each of the emitter regions 15 and the contact regions 16 are exposed on the front surface of the semiconductor substrate 2 between adjacent trench gates 3. Notably, in FIGS. 2 and 3, some of the configurations (contact plugs 5, barrier metal film 8, front surface electrode 21 and rear surface electrode 22) are omitted for the sake of easier view of the drawings.

The trenches 31 extend from the front surface of the semiconductor substrate 2 in a depth direction (z direction). The trenches 31 pierce through the emitter regions 15 and the body region 14, and extend into the drift region 13. The gate insulating films 33 cover the inner surfaces of the respective trenches 31. The gate insulating films 33 are made for example of silicon dioxide ($SiO_2$). The gate electrodes 32 are insulated from the semiconductor substrate 2 by the gate insulating films 33. The gate electrodes 32 are exposed on the front surface of the semiconductor substrate 2. The gate electrodes 32 are connected to a gate wiring that is not shown. The gate electrodes 32 are made for example of aluminum or polysilicon.

The rear surface electrode 22 makes contact with the collector region 11. The front surface electrode 21 makes contact with the contact plugs 5. Further, the front surface electrode 21 covers the interlayer insulating film 4. The rear surface electrode 22 and the front surface electrode 21 are made of metal, for example copper or aluminum.

The interlayer insulating film 4 is provided on the front surface of the semiconductor substrate 2. As a material of the interlayer insulating film 4, for example of silicon dioxide ($SiO_2$) may be exemplified. The interlayer insulating film 4 can be formed for example by chemical vapor deposition (CVD). The interlayer insulating film 4 comprises a plurality of first portions 41 and a plurality of second portions 42 that intersects with the first portions 41. Further, the interlayer insulating film 4 further comprises a plurality of openings (contact holes) 45. The plurality of first portions 41 is arranged adjacent one another with intervals in the lateral direction (x direction). Further, the plurality of first portions 41 is arranged to extend in parallel along the vertical direction (y direction). The plurality of first portions 41 is provided in stripes when observed along the direction perpendicular to the front surface of the semiconductor substrate 2. Each of the first portions 41 is provided along the front surface of its corresponding trench gate 3 so as to cover the corresponding trench gate 3. The first portions 41 are provided on the trench gates 3 and cover the gate electrodes 32.

The plurality of second portions 42 is provided between adjacent first portions 41. The first portions 41 and the second portions 42 extend in directions that intersect each other. The first portions 41 and the second portions 42 are configured integrally. A film thickness of the first portions 41 and a film thickness of the second portions 42 are the same. Front surfaces of the first portions 41 and front surfaces of the second portions 42 are positioned at the same height.

The plurality of second portions 42 is arranged adjacent one another with intervals in the vertical direction (y direction). The second portions 42 extend in the direction that intersects with the first portions 41. The plurality of second portions 42 is arranged to extend in parallel along the lateral direction (x direction). The plurality of second portions 42 is provided in stripes when observed along the direction perpendicular to the front surface of the semiconductor substrate 2. By having the first portions 31 and the second portions 42, the interlayer insulating film 4 is arranged in a matrix when observed along the direction perpendicular to the front surface of the semiconductor substrate 2. Both ends of each of the second portions 42 make contact with the first portions 41. The second portions 42 are provided on the semiconductor substrate 2 at portions where the trench gates 3 are not provided. The second portions 42 are provided on the emitter regions 15 and the contact regions 16. The second portions 42 cover parts of surfaces of the emitter regions 15 and the contact regions 16.

Figure 4:
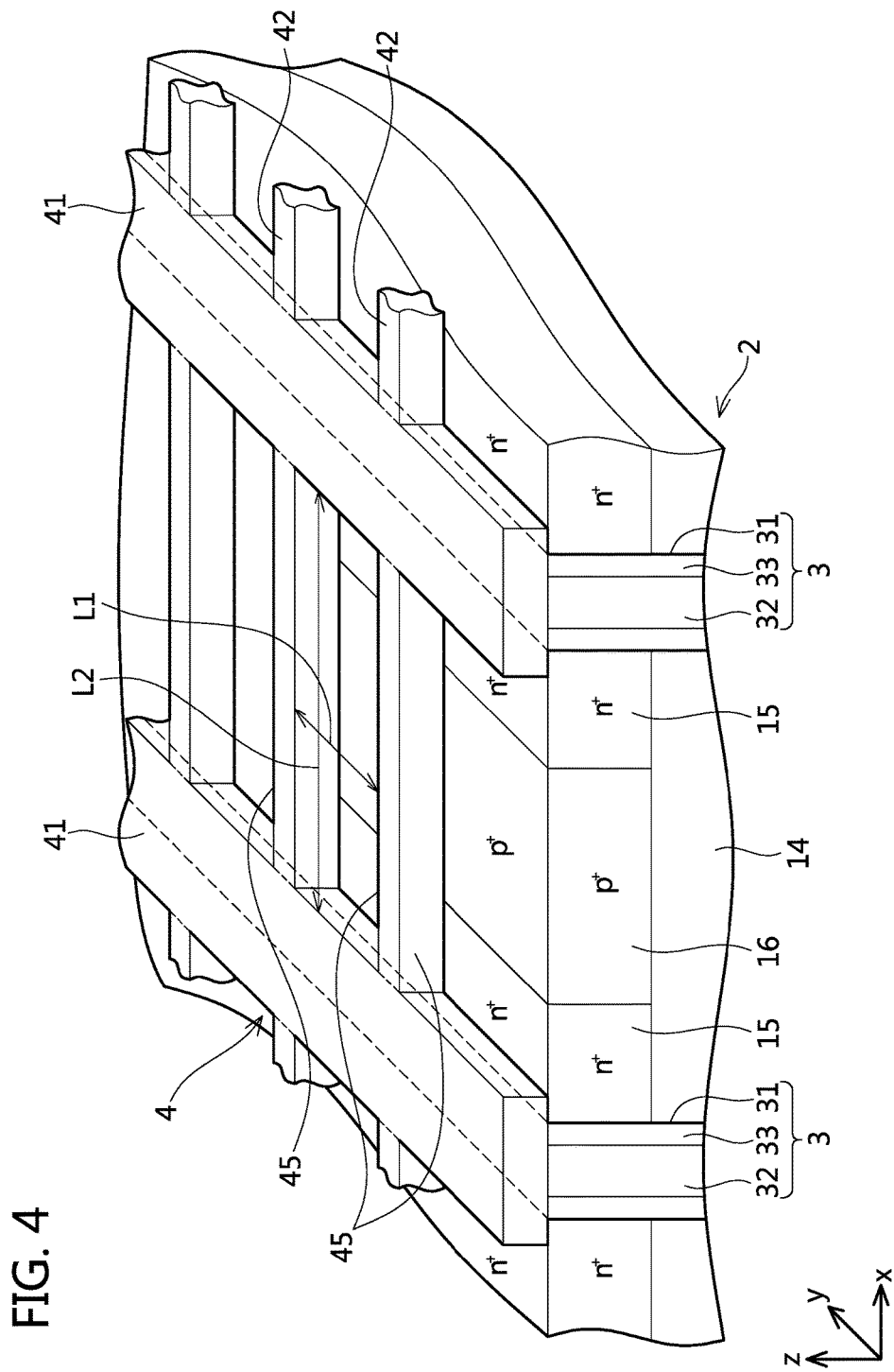
FIG. 4 is a perspective view that shows a part of the semiconductor device of the embodiment in an enlarged view.

As shown in FIGS. 3 and 4, an opening 45 is provided in each region surrounded by the first portions 41 and the second portions 42. Parts of the front surface of the semiconductor substrate 2 are exposed from the openings 45. In the present embodiment, the emitter regions 15 and the contact regions 16 are exposed from the openings 45. In a state where contact plugs 5 and the barrier metal film 8 are not formed yet, the emitter regions 15 and the contact regions 16 are visible through the openings 45. A contact plug 5 is formed in each opening 45. The openings 45 may be formed for example by dry etching the interlayer insulating film 4.

Figure 5:
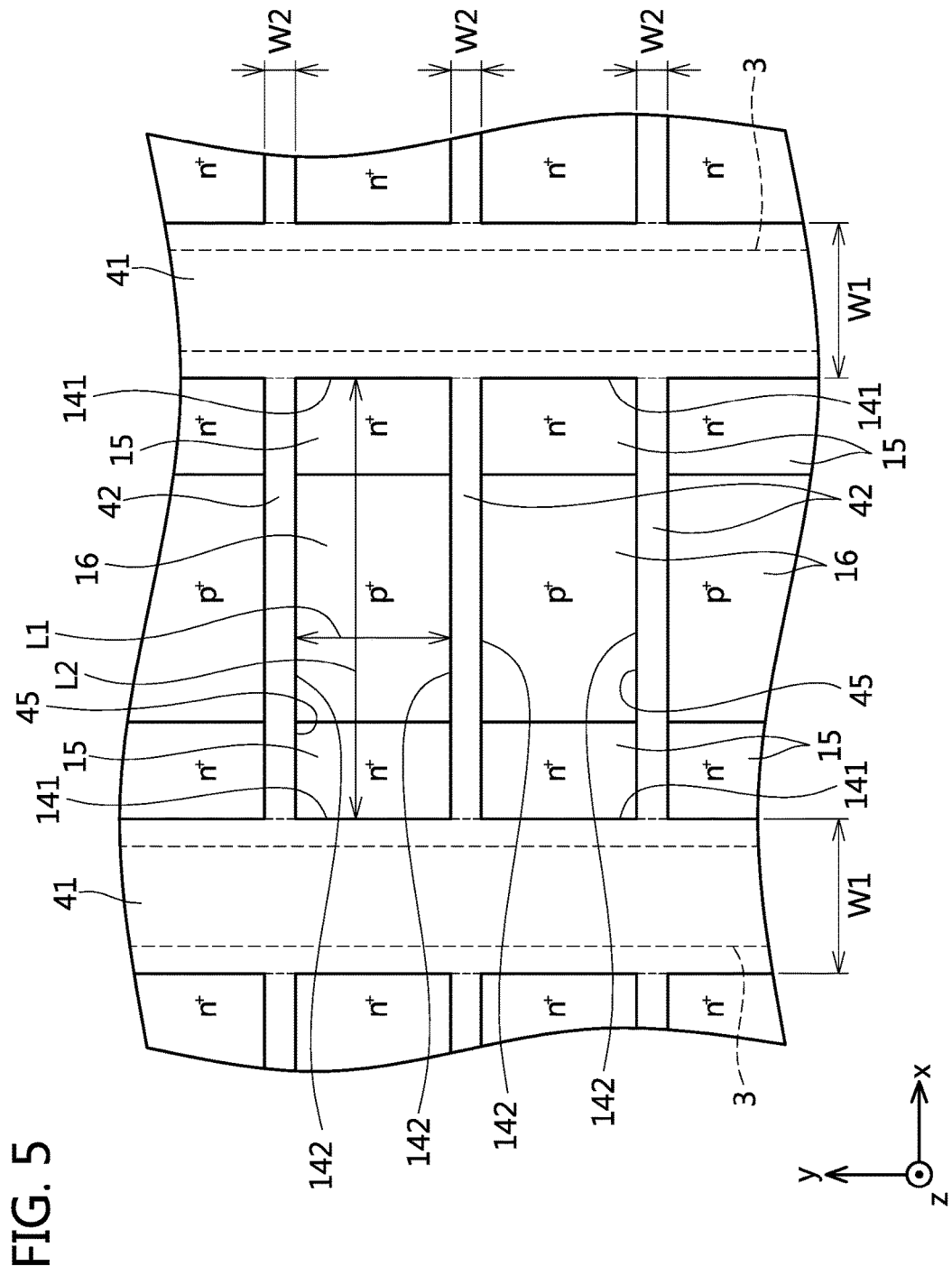
FIG. 5 is a plan view that shows a part of the semiconductor device of the embodiment in an enlarged view.

As shown in FIG. 5, each opening 45 comprises first sides 141 that extend along the first portions 41 and second sides 142 that extend along the second portions 42 when observed along the direction perpendicular to the front surface of the semiconductor substrate 2. A length L1 of the first sides 141 is shorter than a length L2 of the second sides 142. That is, the length L1 of the openings 45 in a direction along the first portions 41 is shorter than the length L2 of the openings 45 in a direction along the second portions 42. In other words, a distance between adjacent second portions 42 is shorter than a distance between adjacent first portions 41. The length L1 of the first sides 141 corresponds to the distance between the adjacent second portions 42. The length L2 of the second sides 142 corresponds to the distance between both ends of a second portion 42 (corresponding to a distance between the adjacent first portions 41).

A width w2 of the second portions 42 in a plan view is smaller than a width w1 of the first portions 41. The width w2 of the second portions 42 corresponds to a distance in a short direction (y direction) of the second portions 42. The width w1 of the first portions 41 corresponds to a distance in a short direction (x direction) of the first portions 41. Due to this, the intervals between the adjacent openings 45 in the short direction of the second portions 42 (y direction: a long direction of the trench gates 3) becomes smaller than the intervals between the openings 45 in a long direction of the second portions 42 (x direction: a short direction of the trench gates 3).

As shown in FIG. 1, the barrier metal film 8 is provided on the emitter regions 15 and the contact regions 16 exposed in the openings 45. Further, the barrier metal film 8 is also provided on front and side surfaces of the interlayer insulating film 4. The bather metal film 8 of the present embodiment is configured of a two-layer structure, and comprises a titanium (Ti) film arranged on the semiconductor substrate 2 and a titanium nitride (TiN) film provided on the titanium film (not shown). The titanium film is provided on a lower side, and the titanium nitride film is provided on an upper side.

The contact plugs 5 are embedded inside the openings 45. The contact plugs 5 are formed on the emitter regions 15 and the contact regions 16. The contact plugs 5 have conductivity. As a material of the contact plugs 5, tungsten (W) for example may be used. The contact plugs 5 may be formed for example by chemical vapor deposition (CVD). Further, the contact plugs 5 can be flattened for example by dry etching. The contact plugs 5 make contact with the emitter regions 15 and the contact regions 16 via the barrier metal film 8.

Figure 6:
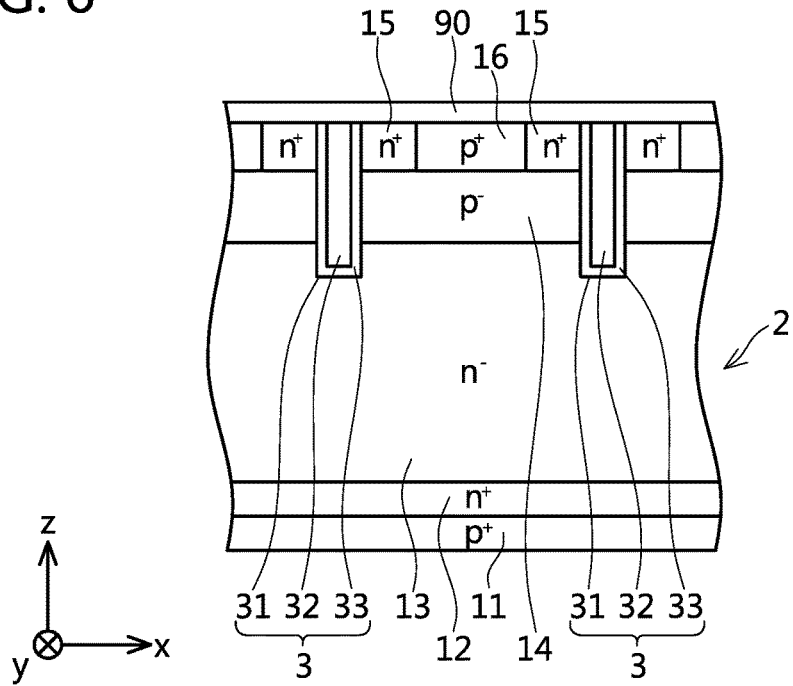
FIG. 6 is a diagram (1) explaining a manufacturing method of the semiconductor device of the embodiment.
Figure 7:
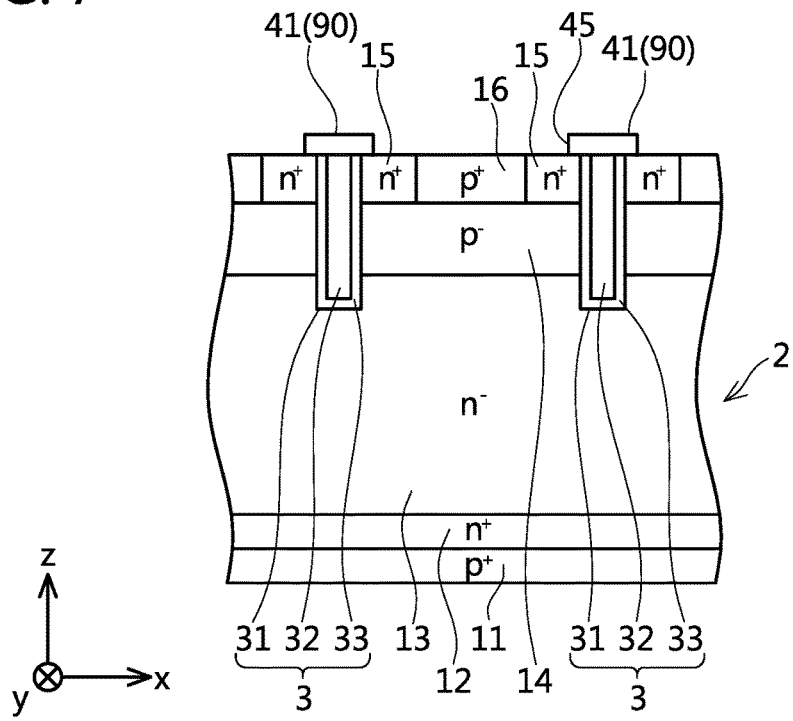
FIG. 7 is a diagram (2) explaining the manufacturing method of the semiconductor device of the embodiment.

Next, a manufacturing method of the semiconductor device having the above configuration will be described. In manufacturing the semiconductor device, firstly the interlayer insulating film 4 is formed on the front surface of the semiconductor substrate 2 (insulating film forming step). More specifically, as shown in FIG. 6, firstly a thin film 90 made of an insulator is deposited by chemical vapor deposition (CVD) on the front surface of the semiconductor substrate 2. Specifically, the semiconductor substrate 2 is placed inside a reaction chamber (not shown), and the material of the interlayer insulating film 4 is supplied into the reaction chamber in a gaseous form, and the thin film 90 is formed on the front surface of the semiconductor substrate 2 by chemical reaction. The thin film 90 is for example a film of silicon dioxide ($SiO_2$). Next, as shown in FIG. 7, parts of the thin film 90 deposited on the front surface of the semiconductor substrate 2 are removed by dry etching. The openings 45 of the interlayer insulating film 4 are formed at the portion that had been removed by the dry etching. Further, the first portions 41 and the second portions 42 of the interlayer insulating film 4 are formed by the thin film 90 that remained without having been removed (in FIG. 7, the depiction of the second portions 42 is omitted). The emitter regions 15 and the contact regions 16 are exposed through the openings 45. Further, the first portions 41 cover the trench gates 3, and the second portions 42 are formed over the emitter regions 15 and the contact regions 16. The interlayer insulating film 4 is thinned as above. Notably, detailed configurations of the semiconductor substrate 2 and the interlayer insulating film 4 have already been described earlier, thus the explanation thereof will be omitted.

Figure 8:
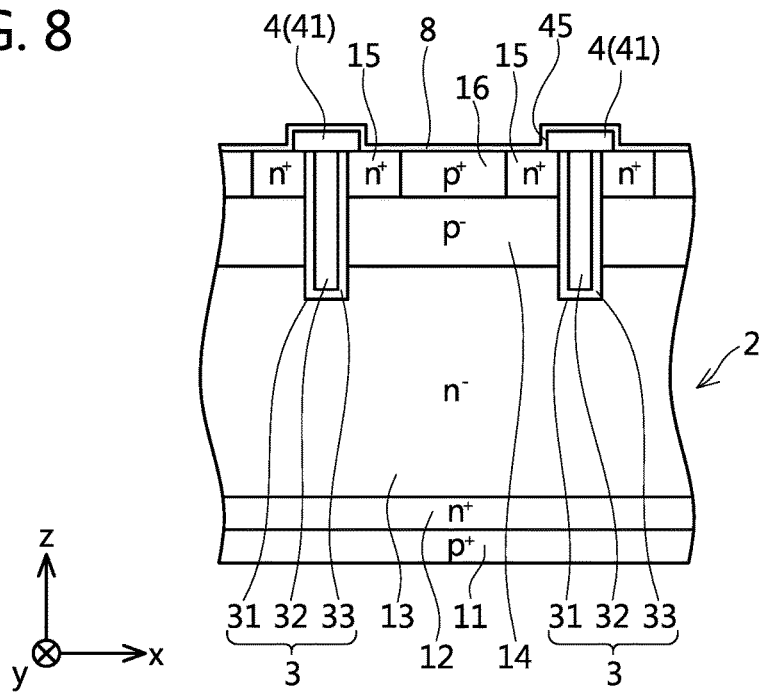
FIG. 8 is a diagram (3) explaining the manufacturing method of the semiconductor device of the embodiment.

Next, as shown in FIG. 8, the barrier metal film 8 is formed on the front surfaces of the semiconductor substrate 2 and the interlayer insulating film 4 (barrier metal film forming step). The barrier metal film 8 may be formed for example by sputtering. The bather metal film 8 is formed over the emitter regions 15 and the contact regions 16 exposed through the openings 45. Further, the bather metal film 8 is formed also on the front and side surfaces of the interlayer insulating film 4.

Figure 9:
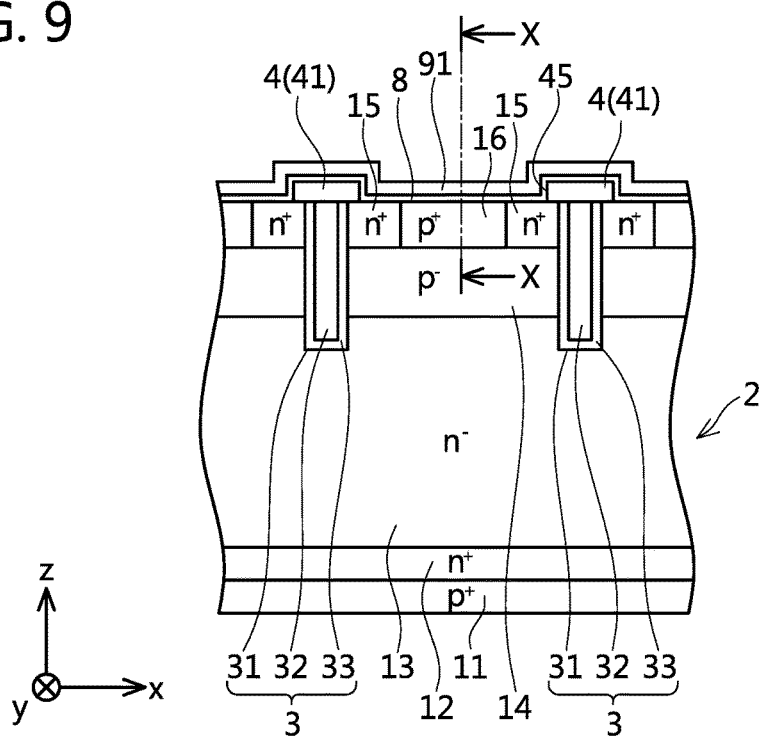
FIG. 9 is a diagram (4) explaining the manufacturing method of the semiconductor device of the embodiment.
Figure 10:
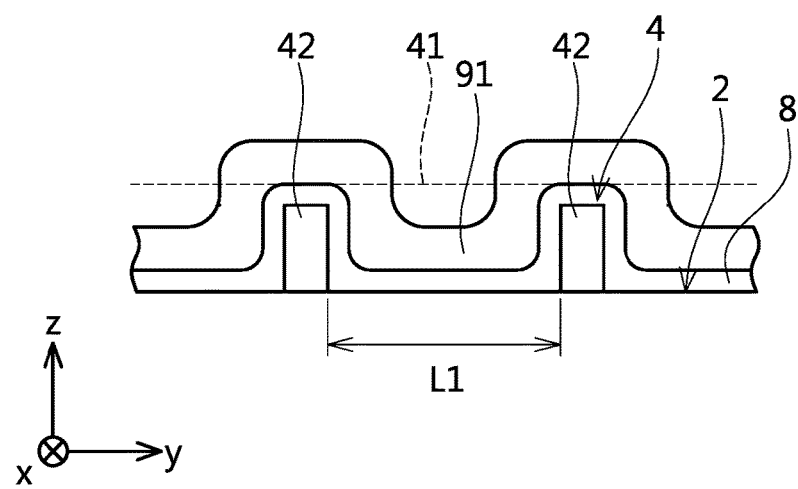
FIG. 10 is a diagram (5) explaining the manufacturing method of the semiconductor device of the embodiment.
Figure 11:
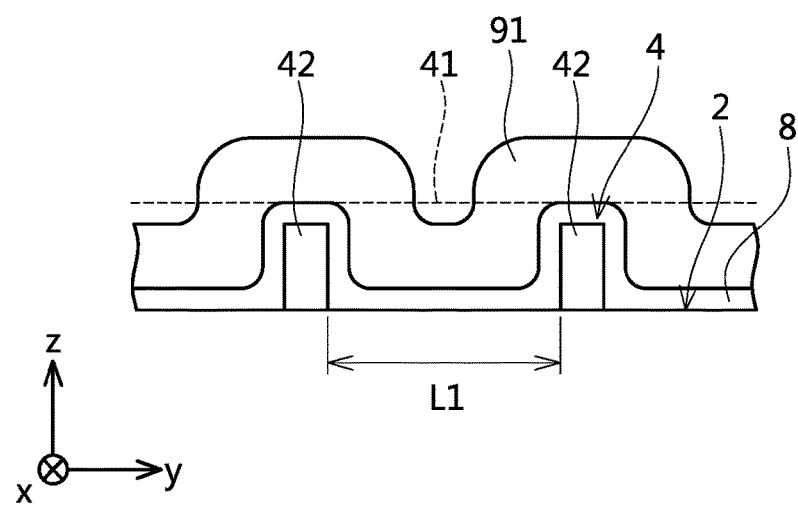
FIG. 11 is a diagram (6) explaining the manufacturing method of the semiconductor device of the embodiment.
Figure 12:
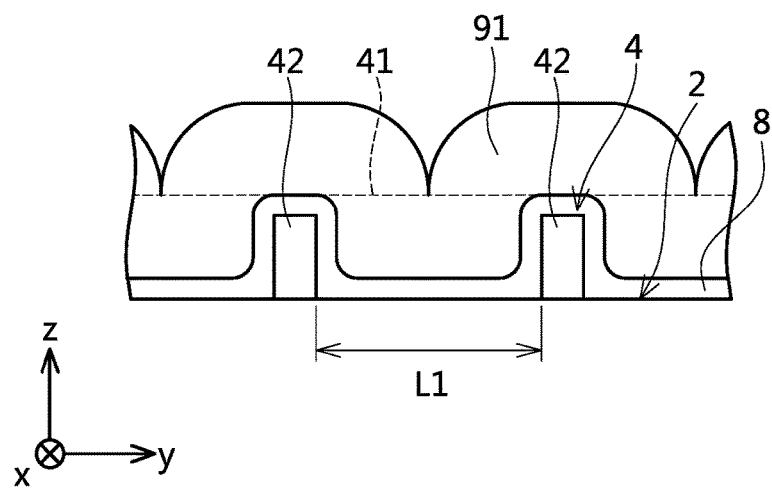
FIG. 12 is a diagram (7) explaining the manufacturing method of the semiconductor device of the embodiment.

Next, the contact plugs 5 are formed in the openings 45 of the interlayer insulating film 4 (plug forming step). In the plug forming step, firstly, as shown in FIG. 9, a material 91 of the contact plugs 5 are deposited in the openings 45 of the interlayer insulating film 4 by chemical vapor deposition (CVD) (depositing step). More specifically, after the barrier metal film forming step, the semiconductor substrate 2 is placed inside the reaction chamber (not shown), and the material of the contact plugs 5 is supplied into the reaction chamber in a gaseous form, and the material 91 is deposited on the barrier metal film 8 by chemical reaction. In the present embodiment, tungsten (W) is used as the material 91 of the contact plugs 5. Further, at this occasion, the material 91 is deposited also on the interlayer insulating film 4. FIG. 10 to FIG. 12 are X-X cross sectional view of FIG. 9. The material 91 of the contact plugs 5 as shown in FIGS. 10 and 11 grows upward on the semiconductor substrate 2 and the interlayer insulating film 4 (first portions 41 and second portions 42). The material 91 of the contact plugs 5 grow upward within the openings 45. Further, the material 91 of the contact plugs 5 grows not only upward, but also laterally from the side surfaces of the first portions 41 and the second portions 42. As time passes, as shown in FIG. 12, the material 91 of the contact plugs 5 is filled within entireties of the openings 45. Further, the material 91 of the contact plugs 5 is deposited on outside of the openings 45 as well. The material 91 of the contact plugs 5 is deposited upward from the upper surface of the interlayer insulating film 4 and covers the interlayer insulating film 4. Accordingly, a thin film made of the material 91 of the contact plugs 5 is thus formed. Notably, from the viewpoint of quickly filling the material 91 of the contact plugs 5 into the openings 45, the length L1 of the first sides 141 of the openings 45 is preferably shorter than a length that is twice the film thickness of the second portions 42 of the interlayer insulating film 4.

Figure 13:
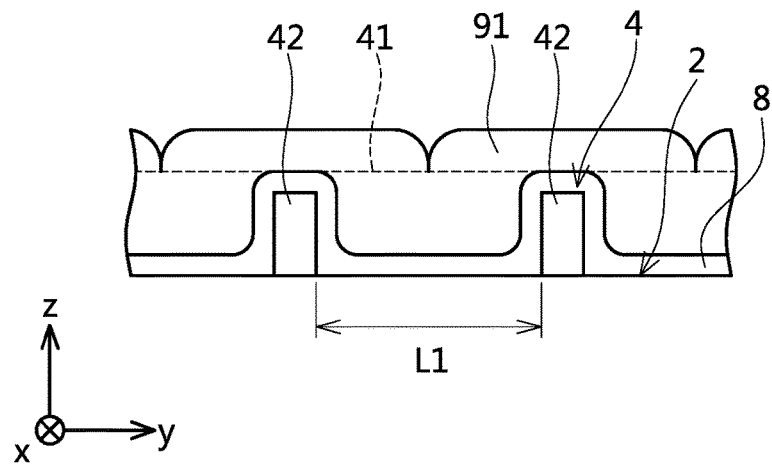
FIG. 13 is a diagram (8) explaining the manufacturing method of the semiconductor device of the embodiment.

Next, the material 91 of the contact plugs 5 deposited higher than the interlayer insulating film 4 is removed (removing step), More specifically, as shown in FIG. 13, the material 91 of the contact plugs 5 covering the interlayer insulating film 4 (first portions 41 and second portions 42) is removed by the dry etching. The material 91 of the contact plugs 5 is removed until the front surface of the interlayer insulating film 4 is exposed. Due to this, the excessive portion of the deposited material 91 of the contact plugs 5 is removed. As above, the contact plugs 5 can be formed in the openings 45.

Thereafter, the front surface electrode 21 is formed on the contact plugs 5 and the interlayer insulating film 4. Further, the rear surface electrode 22 is formed under the semiconductor substrate 2. Due to this, as shown in FIG. 1, the semiconductor device 1 can be manufactured.

As is apparent from the above description, when the material 91 of the contact plugs 5 is deposited in the openings 45 of the interlayer insulating film 4, the material 91 of the contact plugs 5 is deposited in the openings 45 not only upward but also laterally. Due to this even if the deposited amount of the material 91 of the contact plugs 5 is relatively small, the entireties of the openings 45 can be filled by the material 91 of the contact plugs 5. Thus, the material 91 of the contact plugs 5 can quickly be filled in the entireties of the openings 45. Further, the film thickness of the thin film made by the material 91 of the contact plugs 5 thin.

Figure 14:
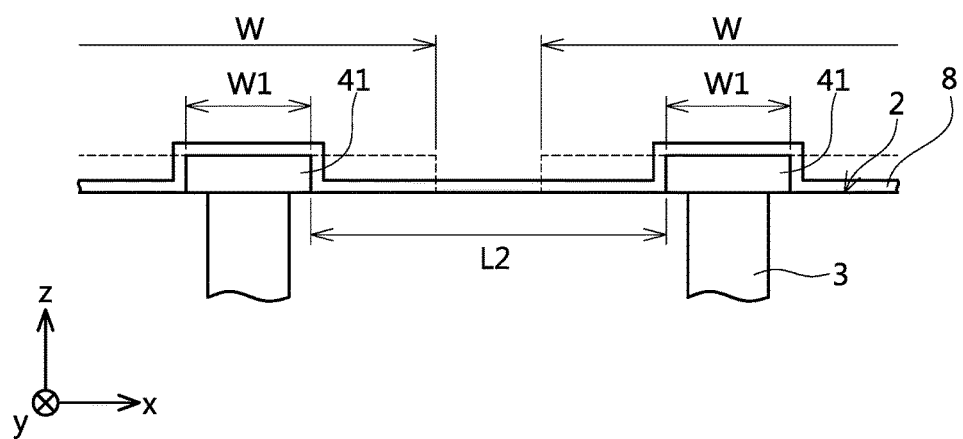
FIG. 14 is a cross sectional view that shows a part of another semiconductor device in an enlarged view.

Further, since the interlayer insulating film 4 is provided with the plurality of second portions 42, positions of the second portions 42 can be adjusted to shorten the distance between adjacent second portions 42, that is, the length L1 of the openings 45 in the direction along the first portions 41. The length L1 of the openings 45 of the interlayer insulating film 4 in the direction along the first portions 41 is made shorter than the length L2 in the direction along the second portions 42. Due to this, when the material 91 of the contact plugs 5 grows within the openings 45, the entireties of the openings 45 are filled even quicker by the material 91 of the contact plugs 5. Notably, when the distance between the adjacent first portions 41 in the interlayer insulating film 4, that is, the length L2 of the openings 45 in the direction along the second portions 42 is made short, a contact resistance may possibly become higher than in a case of shortening the length L1 in the direction along the first portions 41. That is, as shown in FIG. 14, the first portions 41 of the interlayer insulating film 4 need to cover the trench gates 3 so as to insulate the trench gates 3. If the distance between the adjacent first portions 41, that is, the length L2 of the openings 45 in the direction along the second portions 42, is attempted to be shortened in a state where the first portions 41 cover the trench gates 3, the first portions 41 must be widened laterally as shown by dotted lines in FIG. 14. That is, the width of the first portions 41 must be enlarged. In so doing, the lateral widening of the first portions 41 brings forth an area increase in the first portions 41 covering the front surface of the semiconductor substrate 2, as a result of which a region covered by the first portions 41 is increased. Due to this an area of the front surface of the semiconductor substrate 2 exposed from the openings 45 is decreased, and the contact resistance may possibly be increased. However, since the second portions 42 of the interlayer insulating film 4 do not need to cover the trench gates, thus their positions can freely be adjusted without giving consideration to the trench gates 3. Due to this, the distance between the adjacent second portions 42, that is, the width of the second portions 42 does not need to be enlarged upon shortening the length L1 of the openings 45 in the direction along the first portions 41. That is, the length L1 can be shortened simply by adjusting the positions of the second portions 42 having the smaller width W2 than the width W1 of the first portions 41. Accordingly, the contact resistance can be suppressed from becoming large even with shortened length L1 of the openings 45 in the direction along the first portions 41. From the above, the film thickness of the thin film needed to form the contact plugs 5 can be made small while suppressing the contact resistance from becoming large.

One embodiment of the present invention has been explained above, however, specific aspects are not limited to the above embodiment. In the following explanation, the same reference signs used in the above explanation are used here for the same configuration to omit the explanation.

Figure 15:
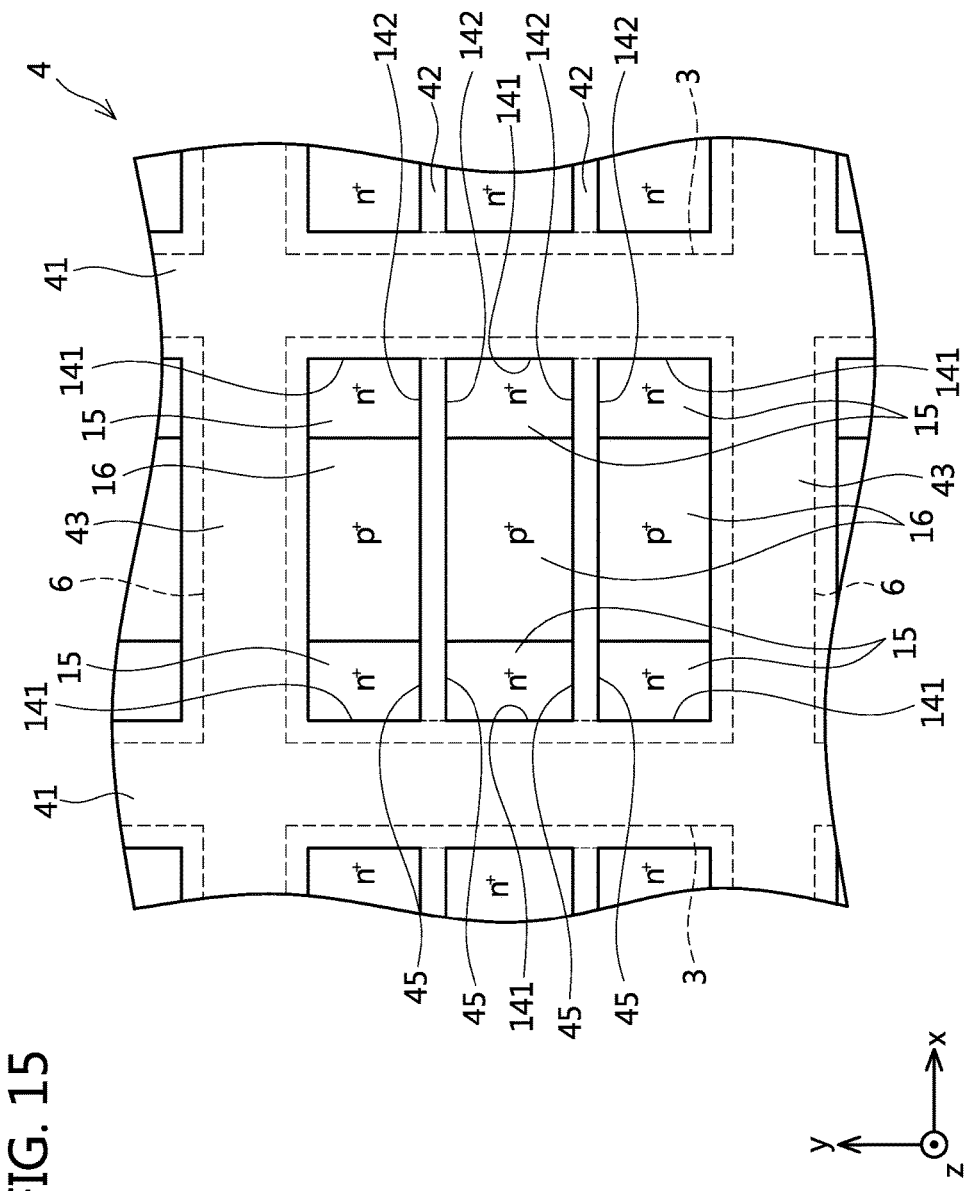
FIG. 15 is a cross sectional view of a semiconductor device of another embodiment.

In other embodiments, as shown in FIG. 15, a plurality of second trench gates 6 may be provided in a direction intersecting with the first trench gates 3. The plurality of second trench gates 6 is arranged adjacent one another with intervals in the vertical direction (y direction). Further, the plurality of second trench gates 6 is arranged to extend in parallel along the lateral direction (x direction). The first trench gates 3 and the second trench gates 6 are provided in directions that intersect each other. Due to this, the pluralities of trench gates (first trench gates 3 and second trench gates 6) is arranged in a matrix when observed along the direction perpendicular to the front surface of the semiconductor substrate 2. The first trench gates 3 and the second trench gates 6 are configured integrally. The emitter regions 15 and the contact regions 16 are exposed on the front surface of the semiconductor substrate 2 between adjacent second trench gates 6. The second trench gates 6 are configured of trench gate insulating film and gate electrodes, similar to the first trench gates 3. The explanation for the trench, the gate insulating film and the gate electrodes will be omitted, since they are the same as those in the aforementioned trench gates 3.

Further, the interlayer insulating film 4 comprises a plurality of third portions 43 that intersects with the first portions 41. The third portions 43 are provided along front surfaces of the second trench gates 6 so as to cover the second trench gates 6. The third portions 43 cover the gate electrodes by being provided on the second trench gates 6. The plurality of third portions 43 is provided between adjacent first portions 41. The first portions 41 and the third portions 43 extend in directions that intersect each other. The third portions 43 extend in a direction parallel to the second portions 42. The first portions 41 and the third portions 43 are configured integrally. The film thickness of the first portions 41 and a film thickness of the third portions 43 are the same. The front surfaces of the first portions 41 and front surfaces of the third portions 43 are positioned at the same height. The plurality of third portions 43 is arranged adjacent one another with intervals in the vertical direction (y direction). The third portions 43 are provided in a direction that intersects with the first portions 41. The plurality of third portions 43 is arranged to extend in parallel along the lateral direction (x direction). By having the first portions 41, the second portions 42, and the third portions 43, the interlayer insulating film 4 is arranged in a matrix when observed along the direction perpendicular to the front surface of the semiconductor substrate 2. Both ends of each of the third portions 43 make contact with the first portions 41.

Further, in the above embodiment, the IGBT has been described as an example of the semiconductor device, however, no limitation is made to this configuration, and other examples of the semiconductor device may be a MOSFET (Metal Oxide Semiconductor Field Effect Transistor), or the like.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

1; Semiconductor device
2; Semiconductor substrate
3; Trench gates (first trench gates)
4; Interlayer insulating film
5; Contact plugs
6; Second trench gates
8; Barrier metal film
11; Collector region
12; Buffer region
13; Drift region
14; Body region
15; Emitter region
16; Contact region
21; Front surface electrode
22; Rear surface electrode
31; Trenches
32; Gate electrode
33; Gate insulating film
41; First portions
42; Second portions
45; Openings
90; Thin film
91; Material
141; First side
142; Second side

The invention claimed is:

1. A semiconductor device comprising:
a plurality of first trench gates provided abreast on a semiconductor substrate;
a plurality of second trench gates provided in a direction intersecting with the first trench gates;
an interlayer insulation film provided on a front surface of the semiconductor substrate, the interlayer insulation film having an opening from which a part of the front surface of the semiconductor substrate is exposed; and
a contact plug provided in the opening,
wherein
the interlayer insulation film comprises a plurality of first portions each of which is provided along a front surface of a corresponding one of the first trench gates to cover the corresponding first trench gate, and lateral portion provided between adjacent first portions and along a direction intersecting with the first portions,
the lateral portion comprises a second portion which is provided along the front surface of the semiconductor substrate so as not to cover the first trench gates and the second trench gates, and a plurality of third portions, each of which is provided along a front surface of a corresponding one of the second trench gates to cover the corresponding second trench gate, and
the opening is provided at an area surrounded by the first portions and the lateral portion, a length of the opening in a direction along the first portions is shorter than a length of the opening in a direction along the lateral portion intersecting with the first portions and shorter than a length that is twice a film thickness of the lateral portion.

2. The semiconductor device according to claim 1, wherein a width of the second portions in a direction along the first trench gates is narrower than a width of the first portions in a direction along the second trench gates and narrower than a width of the third portions in the direction along the first trench gates in a plan view.

3. A method of manufacturing a semiconductor device that comprises a plurality of first trench gates provided abreast in a semiconductor substrate, a plurality of second trench gates provided in a direction intersecting with the first trench gates, and an interlayer insulation film provided on a front surface of the semiconductor substrate and having an opening from which a part of the front surface of the semiconductor substrate is exposed,
the method comprising forming a contact plug in the opening,
wherein
the interlayer insulation film comprises a plurality of first portions, each of which is provided along a front surface of a corresponding one of the first trench gates to cover the corresponding first trench gate, and lateral portion provided between adjacent first portions and along a direction intersecting with the first portions,
the lateral portion comprises a second portion which is provided along the front surface of the semiconductor substrate so as not to cover the first trench gates and the second trench gates, and a plurality of third portions, each of which is provided along a front surface of a corresponding one of the second trench gates to cover the corresponding second trench gate, and the opening is formed at an area surrounded by the first portions and the lateral portion, a length of the opening in a direction along the first portions is shorter than a length of the opening in a direction along the lateral portion intersecting with the first portions and shorter than a length which is twice a film thickness of the lateral portion.

4. The method of manufacturing a semiconductor device according to claim 3, wherein the forming of the contact plug comprises a step of depositing a material of the contact plug in the opening, and removing the material of the contact plug deposited above the interlayer insulation film.

* * * * *